United States Patent

Saen et al.

[11] Patent Number: 5,483,021
[45] Date of Patent: Jan. 9, 1996

[54] FLAT CABLE

[75] Inventors: Haruo Saen; Ryuzo Suzuki, both of Tochigi, Japan

[73] Assignee: Sumitomo Electric Industries, Ltd., Osaka, Japan

[21] Appl. No.: 222,306

[22] Filed: Apr. 4, 1994

[30] Foreign Application Priority Data

Apr. 6, 1993 [JP] Japan .................................. 5-078397
Jul. 26, 1993 [JP] Japan .................................. 5-183994

[51] Int. Cl.$^6$ .................................................. H10B 7/08
[52] U.S. Cl. .................................. 174/117 FF; 174/94 R; 174/126.2; 174/268
[58] Field of Search ........................... 174/117 F, 117 FF, 174/268, 94 R, 126.2, 126.1

[56] References Cited

U.S. PATENT DOCUMENTS

| 101,264 | 3/1870 | Hill | 174/126.2 |
|---|---|---|---|
| 3,168,617 | 2/1965 | Richter | 174/117 FF |
| 3,408,453 | 10/1968 | Shelton, Jr. | 174/68.5 |
| 3,513,045 | 5/1970 | Emmel et al. | 156/55 |
| 3,683,103 | 8/1972 | Mancino | 174/119 C |
| 3,692,924 | 9/1972 | Nye | 174/120 SR |
| 3,881,999 | 5/1975 | Toth et al. | 204/33 |
| 4,218,581 | 8/1980 | Suzuki | 174/117 F |
| 4,375,379 | 3/1983 | Luetzow | 174/117 F |
| 4,694,123 | 9/1987 | Massey | 174/117 FF |
| 5,281,765 | 1/1994 | Iura et al. | 174/117 F |

FOREIGN PATENT DOCUMENTS

| 1590456 | 5/1970 | Germany . |
|---|---|---|
| 4239982 | 6/1993 | Germany . |
| 115787 | 9/1979 | Japan .................................. 174/126.2 |

OTHER PUBLICATIONS

Patent Abstracts Of Japan, vol. 17, No. 133 (M–1383) 19 Mar. 1993 & JP-A-43 013 440 (Totoku Electric) Nov. 5, 1992 *abstract*.

*Primary Examiner*—Morris H. Nimmo
*Attorney, Agent, or Firm*—Cushman Darby & Cushman

[57] ABSTRACT

A laminated flat cable uses a flat conductor which is treated substantially uniformly with an anticorrosion plating having a given thickness over the whole periphery thereof to provide a laminated flat cable which can provide a stable contact reliability with respect to a connector and a stable voltage withstand between conductors in a long period of use in which the cable is repeatedly inserted into and removed from the connector.

8 Claims, 1 Drawing Sheet

FLAT CABLE

BACKGROUND OF THE INVENTION

1. Field of the Invention

The present invention relates to a laminated flat cable which is widely used as an internal wiring for various electronic machine application products such as an electronic desk-top computer, a printer, a copying machine and the like.

2. Description of the Related Art

To manufacture a laminated flat cable, a plurality of flat conductors are disposed at a predetermined interval in parallel to one another, and two polyester films each having polyester system adhesives attached thereto are laminated onto the upper and lower surfaces of the flat conductors from above and below with the adhesives attached surfaces of the two polyester films facing each other, thereby producing an insulating layer. This type of flat cable provides a small space factor and is thus advantageous in making a compact machine. Therefore, the flat cable is used in various machines. In particular, a method has been frequently used in which, while the conductor of the flat cable existing in one surface of the end portion of the flat cable is exposed, the flat cable is used in combination with a removable connector (that is, a connector which allows insertion and removal), because the method is convenient in handling, for example, it allows easy change and replacement of parts, wirings and the like.

As the method using a combination of the removable connector with the flat cable of this type has become more widespread, there has arisen a request for a stable contact reliability with respect to the removable connector which have to be frequently inserted into and removed from the flat cable of this type for a long period of use. In addition as the results of various tests for enhancement of the contact reliability with respect to the removable connector, found is that the contact reliability for a long period of use is closely connected with an anticorrosion plating to be enforced on the conductor.

In other words, as a conductor to be used in the laminated flat cable of this type, when an anticorrosion plated copper foil is slit into a given width and is then used, i.e., such slit copper foil is used in a state in which the slit surface thereof does not include any anticorrosion plating, the conductor of this type raises a problem as to the contact reliability for a long period of use. On the other hand, when the conductor is used after the slit surface thereof is also anticorrosion plated, then no problem as to the contact reliability arises even when the conductor is used for a long period of time. At the same time, however, if an excessive anticorrosion plating is applied to the slit surface, then the excessive anticorrosion plating can contact a guide member or the like of a laminator and thus can be scraped off, thereby producing plating refuse when the flat cable is manufactured; that is, the excessive anticorrosion plating gives rise to another problem.

SUMMARY OF THE INVENTION

As described above, if a conductor including a portion with an anticorrosion plating having a thickness less than a predetermined value is used as a conductor, then there arises a problem as to the contact reliability when the conductor is used for extend periods. Also, when a conductor including a portion with an anticorrosion plating having an excessively great thickness is used, then there arises another problem that plating refuse is easily produced.

Accordingly, it is an object of the present invention to provide a flat cable which have not only a good contact reliability for long use but also no problem of production of the plating refuse, and conductors of which is anticorrosion plated almost uniformly with a given thickness over the whole periphery thereof.

As mentioned above, to obtain a flat conductor which is almost uniformly plated with a corrosion resisting material with a predetermined thickness over the whole periphery thereof, there is available a method in which a copper foil plated with a corrosion resisting material is slit and the slit surface is also plated uniformly while the plating condition is sufficiently controlled. However, according to another method in which an annealed copper round wire uniformly plated with a corrosion resisting material is rolled flat by use of a roller, it is possible to obtain more easily a flat conductor which is uniformly plated with a corrosion resisting material.

PREFERRED EMBODIMENT OF THE INVENTION

The preferred embodiment of the present invention will be described accompanying with the drawings as follows.

Figure 3A:
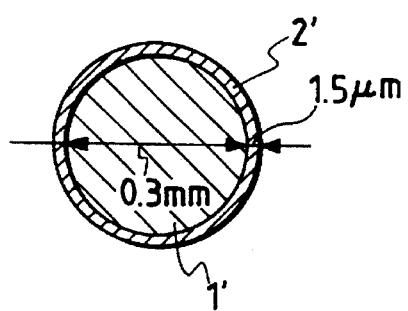
FIG. 3(a) is a section view showing a annealed copper wire with a tin plating.
Figure 3B:
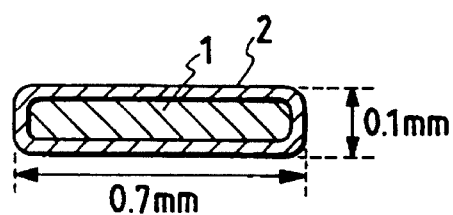
FIG. 3(b) is a section view showing a flat conductor.

A annealed copper wire 1' of 0.3 mm$\phi$ with a tin plating 2' having a thickness of 1.5 μm as shown in FIG. 3(a) was rolled by a roller to produce a flat conductor 10 having a long diameter of 0.7 mm and a short diameter of 0.1 mm as shown in FIG. 3(b), and then the flat conductor 10 was heated and softened under a predetermined condition. As a result of this, there was obtained a flat conductor 10, in which the thickness of the tin plating 2 was substantially uniform over the whole peripheries of the flat conductor 10, that is, ranging from the maximum thickness of 1.6 μm to the minimum thickness of 1.2 μm.

Also, by using two annealed copper round wire 10 which was plated respectively with solder and nickel instead of tin, a similar process to the above was executed. As a result of this, similarly to the tin plating, there were obtained two flat conductors in which the respective thicknesses of the solder and nickel platings were substantially uniform over the whole peripheries of the respective flat conductors.

Figure 1:
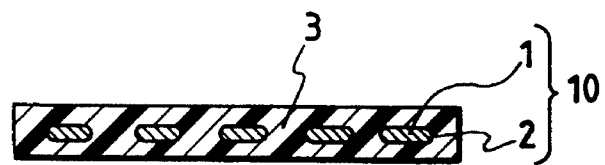
FIG. 1 is a cross-sectional view of a flat cable according to the invention.
Figure 2:
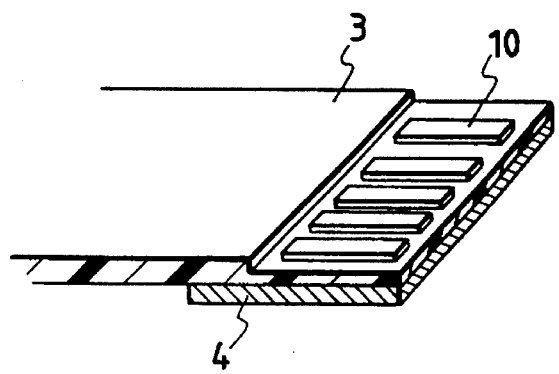
FIG. 2 is a perspective view of one end portion of a conductor when one side surface of the conductor is exposed for fit with a connector.

Five to every three kinds of flat conductors 10 obtained in the above-mentioned manner, that is, respectively plated with corrosion resistant materials 2 (that is, tin, solder and nickel) having a predetermined and uniform thickness over the whole peripheries thereof were arranged parallel to one another at a pitch of 1 mm, insulating polyester films 3 each with polyester system adhesives were laminated onto the flat conductors 10 from above and below, with the adhesives surfaces thereof opposed to the flat conductors as shown in FIG. 1. Further, the flat conductors were respectively cut to a given length and one surface of the end portion of each of the flat conductors was exposed by peeling off the insulation of the end portion from the one surface thereof, and a reinforcing plate 4 was attached on another side, thereby producing three kinds of laminated flat cables as shown in FIG. 2.

In the laminated flat cable using a flat conductor with an anticorrosion plating having a thickness of 1 μm or more and almost uniform over the whole periphery thereof, in any of tin, solder and nickel platings, no plating refuse can be produced during the laminating operation, even a flat cable having a pitch of 1 mm can provide a good voltage withstand between the conductors, and such flat conductor is able to meet the need for a further higher density wiring such as a wiring at a 0.5 mm pitch and the like. Also, such flat conductor can provide a good contact reliability at the end portion thereof with a connector and, even in a humidity withstand tests after the insertion into and removal from the connector, no increase in the contact resistance thereof was found. In addition, the laminated flat cable of the present invention can be obtained not only by a flat conductor produced by slitting an anticorrosion plated copper foil into a predetermined width, but also by a conductor which is produced by anticorrosion plating the slit surface as well with a predetermined thickness to thereby provide an anticorrosion plating with a uniform thickness of 1 μm or more over the whole periphery thereof. Also, it can be obtained by a conductor which is produced by rolling an annealed copper round wire with such a uniform thickness as mentioned in the above embodiment into a given flat conductor. In the present invention, it is preferable to use such a conductor that has been anticorrosion plated with an almost uniform thickness over the whole periphery thereof.

When an anticorrosion plated copper foil was slit into a predetermined width and was then used while the slit surface was exposed, that is, the copper thereof was exposed, then an increase in the contact resistance thereof was detected in a humidity withstand test after the conductor had been inserted into and removed from a connector and, in the worst case, there was found such a conductor that was not able to conduct at all. However, after the slit surface of the conductor was anticorrosion plated, if the conductor was used, no increase in the contact resistance thereof was found even when a humidity withstand test was conducted similarly after its insertion into and removal from its associated connector. On the other hand, when a conductor including a portion having an unnecessarily thick anticorrosion plating thickness, such as a conductor including a slit surface having an anticorrosion plating thickness of 4 to 5 μm, was used, then the anticorrosion plating was scraped off due to its contact with a guide member and the like when the conductor was laminated, thereby producing plating refuse. Thus, the plating refuse was laminated together with the conductor, with the result that an interconductor voltage withstand was lowered to an extreme extent. Accordingly, it is preferable that the thickness of the plating is 1 to 3 μm.

What is claimed is:

1. A laminated flat cable comprising:

a plurality of flat conductors, wherein each of said flat conductors is uniformly coated with an anticorrosion plating having a predetermined thickness over an entire periphery thereof.

2. A laminated flat cable according to claim 1, wherein said predetermined thickness is from 1 μm to 3 μm.

3. A laminated flat cable according to claim 1, wherein said anticorrosion plating comprises one of a tin plating, a solder plating and a nickel plating.

4. A laminated flat cable according to claim 1, wherein said conductors comprises copper.

5. A laminated flat cable comprising:

a plurality of flat conductors, each of which is uniformly coated with an anticorrosion plating having a predetermined thickness over an entire periphery thereof; and two laminating insulating films for laminating each other to put said plurality of flat conductors therebetween, and for insulating each of said flat conductors;

wherein said laminated flat conductors are disposed parallel to one another at a predetermined pitch.

6. A flat conductor for a laminated flat cable comprising:

a center conductor, and an anticorrosion plating having a uniform predetermined thickness over an entire periphery of said center conductor.

7. A flat conductor for a laminated flat cable according to claim 6, wherein said predetermined thickness is from 1 μm to 3 μm.

8. A flat conductor for a laminated flat cable according to claim 6, wherein said anticorrosion plating comprises one of a tin plating, a solder plating and a nickel plating.

* * * * *